United States Patent [19]
Keller et al.

[11] 3,970,966
[45] July 20, 1976

[54] CRYSTAL OSCILLATOR TEMPERATURE COMPENSATING CIRCUIT

[75] Inventors: Anthony Francis Keller, Chicago; Dennis Fisher Marvin, Bensenville, both of Ill.

[73] Assignee: Motorola, Inc., Schaumburg, Ill.

[22] Filed: Apr. 25, 1975

[21] Appl. No.: 571,663

[52] U.S. Cl............................. 331/116 R; 331/176
[51] Int. Cl.².................... H03B 5/04; H03B 5/36
[58] Field of Search.................. 331/176, 66, 116 R

[56] References Cited
UNITED STATES PATENTS

| | | | |
|---|---|---|---|
| 3,054,966 | 9/1962 | Etherington | 331/176 X |
| 3,176,244 | 3/1965 | Newell et al. | 331/176 X |
| 3,508,168 | 4/1970 | Chan | 331/176 X |
| 3,831,111 | 8/1974 | Lafferty | 331/176 X |

*Primary Examiner*—Siegfried H. Grimm
*Attorney, Agent, or Firm*—James W. Gillman; Phillip Melamed

[57] ABSTRACT

A circuit for generating a temperature varying control voltage which is applied to a varactor diode to temperature compensate a crystal oscillator is disclosed. The circuit produces a substantially linear voltage versus temperature variation, including a point of inflection, in a middle temperature range, and a substantially non-linear voltage versus temperature variation in hot and cold temperature ranges. The control voltage versus temperature characteristic also undergoes a change in slope polarity in both the hot and cold temperature ranges. The temperature compensating circuit has a middle range circuit for independently creating the substantially linear variation in the middle temperature range, a cold range circuit operative below a predetermined temperature for creating the desired variation in the cold temperature range, and a hot temperature circuit operative above a predetermined temperature for creating the desired temperature variation in the hot temperature range. Each temperature range circuit includes a thermistor and a transistor which together control the operative range and the magnitude of the temperature variation contributed by each of the circuits.

22 Claims, 5 Drawing Figures

CRYSTAL OSCILLATOR TEMPERATURE COMPENSATING CIRCUIT

BACKGROUND OF THE INVENTION

The invention relates generally to the field of temperature compensating circuits for crystal oscillators. In particular, the invention concerns a compensating circuit which creates a control voltage that is applied across a varactor diode for maintaining the frequency of a crystal oscillator at a substantially constant value as the temperature of the oscillator is varied.

Oscillators which have a frequency determining crystal are commonly used to provide a stable output frequency. However, the crystals used in such oscillators are temperature sensitive, and therefore temperature compensating apparatus is normally required to maintain an extremely stable oscillator output frequency. Two basic techniques are used for temperature stabilizing the crystal oscillator frequency. One method is to enclose the oscillator within an oven and thereby maintain the crystal at a constant temperature. This requires a large amount of space and consumes a substantial amount of power. Another method, which is the method generally adopted by the present invention, is to generate a temperature varying voltage and apply it across a voltage variable capacitor (varactor diode) to control the resonant frequency of the crystal oscillator.

In most oscillators, the AT cut crystal is commonly used and it has a generally cubic frequency versus temperature characteristic having an inflection point at approximately +26.5°C. The exact temperature characteristics of individual AT cut crystals are quite variable and depend on how the crystal was made. Thus in order to perfectly compensate an oscillator using an AT crystal, the voltage applied to the varactor diode should have a temperature variation which is substantially similar to that of the particular crystal being used.

Some prior circuits have created a cubic law temperature varying voltage by twice multiplying a linearly varying voltage, but such systems are extremely complex and cannot be adequately and easily adjusted to fit the compensating voltage versus temperature curve which is required by any one particular crystal oscillator.

Another common method which partially compensates a crystal oscillator using AT cut crystals uses hot and cold temperature range networks to produce non-linear temperature variations in a control voltage above and below two predetermined temperatures, while applying a constant control voltage in a middle temperature range. In addition, temperature sensitive capacitors are also used in the crsytal oscillator to minimize the effect of the substantially linear frequency versus temperature variation of the crystal that exists in the middle temperature range. Such circuits only partially compensate the resonant crystal. They are also not suitable for applications in which the crystal is operated in an overtone mode of oscillation, since temperature sensitive capacitors are then generally unable to adequately compensate for the linear variation in the middle temperature range.

Still another method of producing a temperature compensating control voltage, is to use a thermistor and a series of zener diodes having different breakdown voltages to create a "piecewise" non-linear voltage which is adjusted to fit a desired curve. A disadvantage of this system is that any adjustment of an individual piecewise non-linear section, will affect a number of other sections and require their readjustment which will in turn require other subsequent adjustments. An additional disadvantage is that many components are needed to create an adequately fitting composite curve. This composite curve has abrupt (step) changes in slope for every piecewise section and therefore perfect compensation is never feasible. Also, the design of the compensating network is difficult because zener diodes are available with only certain discrete breakdown voltages.

Thus all other prior systems either only partially temperature compensate the crystal oscillator by applying a control voltage across a varactor diode and/or dependently create a temperature varying control voltage which cannot be readily adjusted to exactly compensate any crystal oscillator using a particular AT crystal.

SUMMARY OF THE INVENTION

An object of the invention is to provide an improved and simplified temperature compensating circuit for a crystal oscillator which overcomes the aformentioned deficiencies.

A more particular object of the invention is to provide a temperature compensating circuit which includes a first circuit for independently creating a control voltage having a substantially linear temperature variation in a middle temperature range and a second circuit for modifying the control voltage to provide it with a non-linear temperature variation and a change of slope polarity in either a hot or cold temperature range.

Another object of the invention is to provide a temperature compensating circuit which includes a first circuit for independently creating a control voltage having a stepless substatially linear temperature variation in a middle temperature range and a second circuit for modifying the control voltage to provide it with a non-linear temperature variation in either a hot or cold temperature range.

In one embodiment of the present invention an improved temperature compensating circuit for an oscillator having a frequency determining crystal and operative in cold, middle and hot temperature ranges is provided and comprises: a voltage variable reactance means coupled to the crystal of the oscillator for varying the oscillator frequency in response to a voltage applied to said reactance means; compensating means for generating a control voltage with a voltage versus temperature characteristic having a substantially linear variation in said middle temperature range and a substantially non-linear variation and a change of slope polarity in at least one of said hot and cold temperature ranges; and means for coupling said control voltage to said reactance means whereby said oscillator frequency is maintained at a substantially constant value over all of said temperature ranges; said compensating means including first circuit means for independently creating said linear variation in said middle range and second circuit means for substantially creating said non-linear variation in said one of said temperature ranges.

Basically, a crystal oscillator is compensated by applying a compensating voltage having a predetermined voltage versus temperature characteristic across a varactor diode which controls the resonant frequency of the crystal oscillator. The compensating voltage characteristic is substantially linear in a middle temperature range and is substantially non-linear and has a change in slope directly in a hot or cold temperature range. The inventive compensating circuit includes a first circuit that independently and totally generates a stepless linear middle range temperature variation and a second circuit which substantially creates the desired non-linear variation in either the hot or cold temperature range. By independently creating the control voltage in the middle range, the slope of the control voltage in this range can be varied to any desired value. Since the second circuit substantially controls the non-linear variation in either the hot or cold range, this circuit can be adjusted to create any desired non-linear variation. Therefore by first adjusting the middle range variation and subsequently adjusting the hot or cold range variation, any crystal oscillator can be temperature compensated by the present invention.

A third circuit, for substantially modifying the control voltage in the hot or cold temperature range which is not affected by the second cicuit, can also be used as part of the temperature compensating circuit. This third circuit would preferably function similarly to the second circuit in its effect on the control voltage temperature characteristic.

Additionally, the first circuit provides the control voltage with a point of inflection in the middle temperature range by connecting a resistor in parallel with a thermistor. This point of inflection is required to accurately compensate for the crystal variation which also has a point of inflection. The first circuit is operative in the cold, middle, and hot temperature ranges and, besides creating a linear temperature variation in said middle range, it also creates a non-linear temperature variation in the hot and cold temperature ranges. The second and third circuits are operative, for modifying the temperature variation of the control voltage, only in their respective temperature ranges and therefore adjusting one of them does not affect the other. The operative range of each of the three circuits is substantially determined by an associated thermistor and other components, and the magnitude of the variation contributed by each of the circuits is substantially determined by the magnitude of emitter resistors connected to transistors located in each one of the three circuits.

BRIEF DESCRIPTION OF THE DRAWINGS

For a more complete understanding of the invention reference should be made to the drawings, in which.

DESCRIPTION OF THE PREFERRED EMBODIMENT OF THE INVENTION

Figure 1:
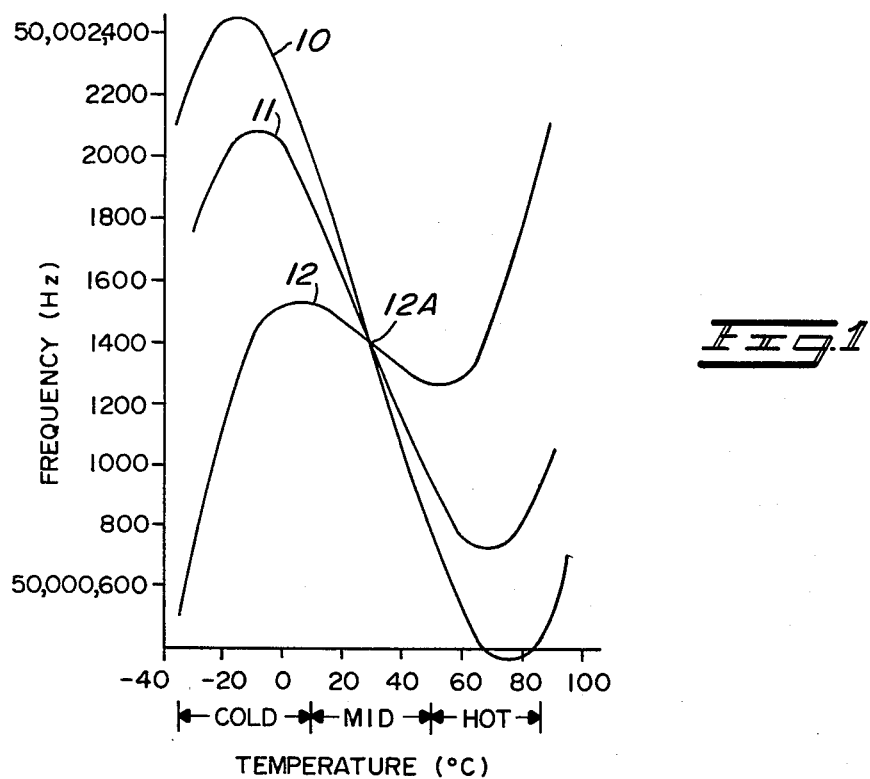
FIG. 1 is a graphical representation of the frequency versus temperature characteristic of three typical AT cut crystals.

Referring to FIG. 1, three frequency versus temperature characteristics 10, 11 and 12 are illustrated for three different uncompensated AT cut crystals. Each of the curves is shown as having a generally cubic (third order) shape including a non-linear portion which undergoes a change in slope polarity in a cold temperature range ($-35°C$ to approximately $+10°C$), a substantially linear portion having a point of inflection 12A in a middle temperature range ($+10°C$ to $+50°C$), and a non-linear portion which undergoes another change in slope polarity in a hot temperature range ($+50°C$ to $+90°C$). A change in slope polarity is defined as a change from a positive slope to a negative slope, or vice versa.

Curves 10, 11, and 12 have their corresponding points of inflection at the same point 12A that is at approximately $+26.5°C$, which is characteristic for all AT cut crystals. They differ slightly from each other in the temperatures at which they undergo their respective changes in slope polarity, but they differ substantially from each other in the magnitude of the slope of their respective substantially linear middle range portions. Thus, FIG. 1 shows the AT cut crystals can have substantially different frequency versus temperature characteristics. Therefore any effective compensating circuit must be capable of providing temperature compensation for a crystal having a characteristic corresponding to any of the curves illustrated in FIG. 1.

Figure 2:
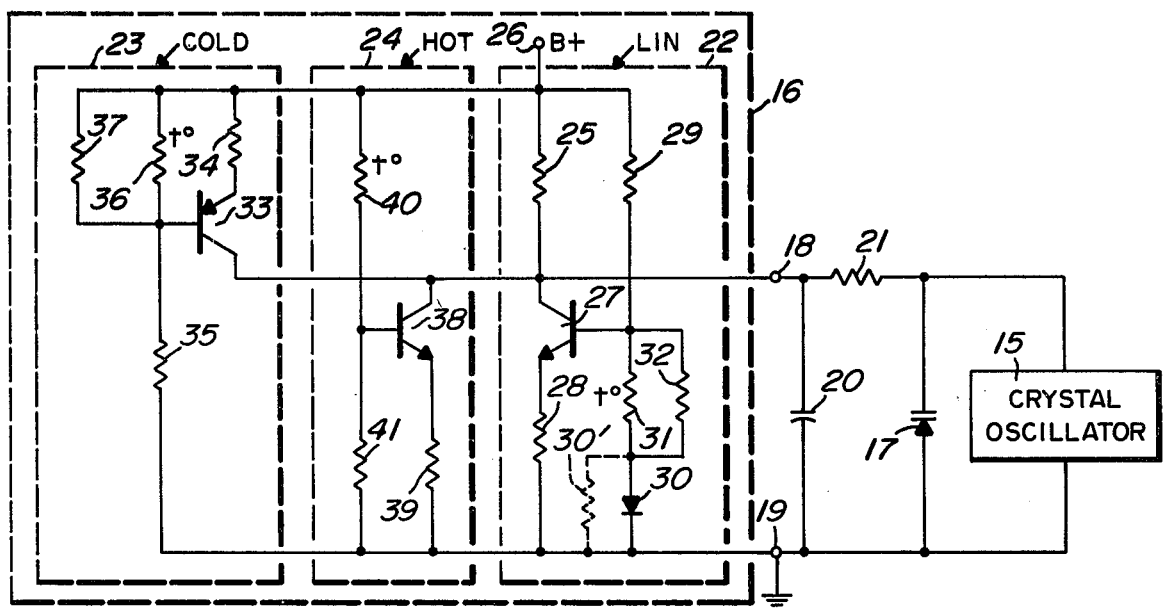
FIG. 2 is a combination block and schematic diagram of a crystal oscillator and the temperature compensating circuit of the present invention.

Referring to FIG. 2, a crystal oscillator 15 is temperature compensated by a voltage generating circuit 16 supplying a control voltage to a varactor diode 17 which is connected to the oscillator for controlling its resonant frequency. The details of the oscillator 15 and its connection to the varactor 17 are not shown since the technique for controlling the resonant frequency of a crystal oscillator by applying a voltage to a varactor diode is well known in the state of the art. The voltage generating circuit 16 produces the control voltage across output terminals 18 and 19 which have an RF bypass capacitor 20 connected therebetween. The terminal 18 is connected to the cathode of the varactor 17 and to the oscillator 15 through an isolating resistor 21. The terminal 19 is connected to ground, to the anode of varactor 17, and to the oscillator 15.

The control voltage applied to the varactor 17 should have a voltage versus temperature characteristic which is similar to the frequency versus temperature characteristic of the crystal in the oscillator 15. Preferably the varactor should be a super abrupt diode which has a substantially linear voltage versus reactance characteristic. When AT cut crystals are used, a control voltage characteristic similar to the curves shown in FIG. 1 is required.

The voltage generating circuit 16 basically comprises a linear middle temperature range circuit 22, a non-linear cold temperature range circuit 23, and a non-linear hot temperature range circuit 24. These circuits combine to produce the desired output control voltage across the terminals 18 and 19. The circuit 22 produces a voltage having a substantially linear voltage versus temperature characteristic, which includes a point of inflection, in a middle temperature range. The circuit 23 substantially creates a non-linear temperature variation in the output control voltage in a cold temperature range, and the circuit 24 produces a non-linear temperature variation in a hot temperature range.

In the middle range circuit 22, a load resistor 25 is connected between a positive power supply ($B^+$) terminal 26 and output terminal 18. An NPN transistor 27 has its collector connected to terminal 18 and its emitter connected to terminal 19 through a resistor 28. The base of the transistor 27 is connected to B+ through a biasing resistor 29 and is connected to ground through a forward biased diode 30 (or a resistor 30' shown dashed and not connected) in series with the parallel combination of a thermistor 31 and a resistor 32. The thermistor 31 has a non-linear and negative resistance versus temperature characteristic and is selected to have a resistance value equal to that of the resistor 32 at +26.5°C. Components 29 through 32 form a biasing network for transistor 27 which keeps the transistor operative throughout the cold, hot, and middle temperature ranges.

In th cold temperature range circuit 23, a PNP transistor 33 has its collector connected to the terminal 18, its emitter connected to B+ through a resistor 34, and its base connected to ground through a resistor 35 and to B+ through a thermistor 36 in parallel with a resistor 37. The thermistor 36 also has a non-linear and negative resistance versus temperature characteristic, as does the thermistor 31. However, the components 35, 36, and 37 are selected to form a biasing network for transistor 33 such that it is only rendered operative when the resistance of thermistor 36 is above a predetermined value. Thus only when the temperature of the thermistor 36 is below a predetermined temperature will transistor 33 be turned on. This occurs because only when the thermistor 36 has a high enough resistance value will a significant voltage drop (greater than 0.7 volts) be present between B+ and the base of transistor 33. Therefore circuit 23 will produce a significant temperature varying output at the collector of the transistor 33 (terminal 18) only in a temperature range below a predetermined temperature.

In the hot temperature range circuit 24, an NPN transistor 38 has its collector connected to the terminal 18, its emitter connected to the terminal 19 through a resistor 39, and its base connected to B+ through a thermistor 40 and to ground through a resistor 41. The thermistor 40 has similar temperature characteristics to the thermistors 31 and 36, and is selected to provide a significant base voltage to the transistor 38 only when the temperature of thermistor 40 is above a predetermined value. Thus the hot circuit 24 is rendered operative to produce a temperature varying output at terminal 18 only in a temperature range above a predetermined temperature value.

Figure 3:
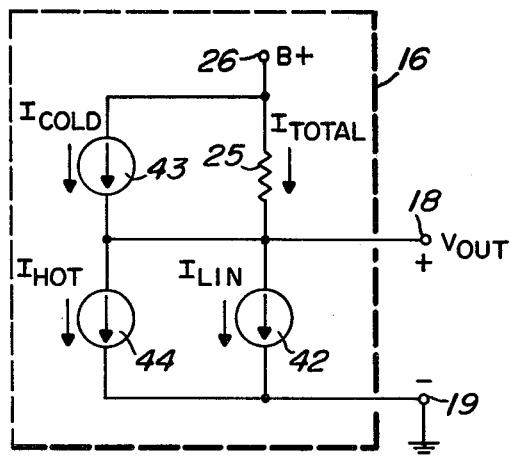
FIG. 3 is a schematic diagram of an equivalent circuit of a portion of the compensating circuit illustrated in FIG. 2.

Referring now to FIG. 3, an equivalent circuit of the voltage generating circuit 16 in FIG. 2 is illustrated and corresponding parts have been identically numbered. The load resistor 25 is connected between B+ terminal 26 and the output terminal 18. A linear current generator 42, generally corresponding to the linear circuit 22, is connected across terminals 18 and 19. A cold current generator 43, corresponding to cold temperature range circuit 23, is connected in parallel with resistor 25. A hot current generator 44, corresponding to the hot range circuit 24, is connected in parallel with linear current generator 42. Thus the output voltage of circuit 16, between terminals 18 and 19, is defined by the equation $V_{out} = B^+ - R_{25} I_{total}$, where $I_{total}$ is equal to the total current flowing through resistor 25. The total current is defined by $I_{total} = I_{lin} + I_{hot} - I_{cold}$, where $I_{lin}$ is the current from th generator 42, $I_{hot}$ is the current from generator 44, and $I_{cold}$ is the current from generator 43.

Figure 4A:
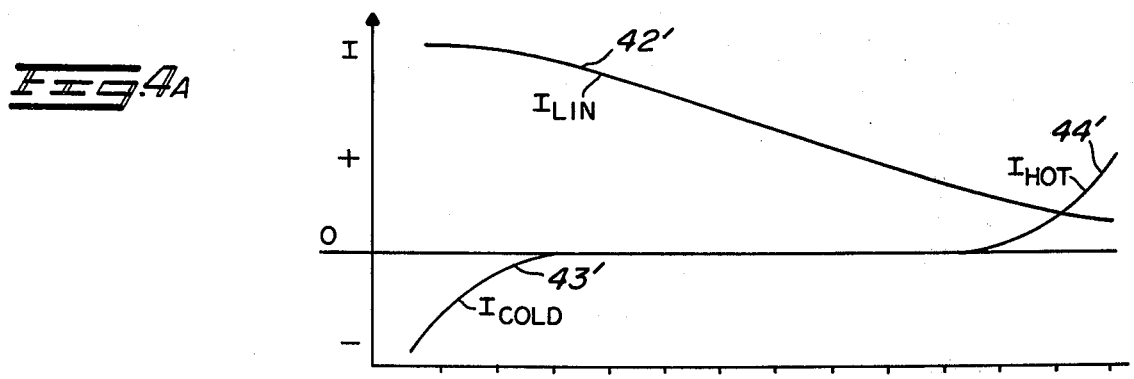
FIG. 4A is a graphical representation illustrating the current versus temperature characteristic of certain components shown in FIG. 3.

FIG. 4A shows the current generated by each of the three current generators in FIG. 3 as a function of temperature. Curves 42', 43', and 44' represent the currents $I_{lin}$, $I_{cold}$, and $I_{hot}$, respectively.

The curve 42' ($I_{lin}$) has a stepless primarily linear temperature variation, including a point of inflection, in the middle temperature range (+10°C to +50°C) and asymptotically approach a high current value in the cold temperature range (−35°C to +10°C) and a low current value in the hot temperature range (+50°C to +90°C).

$I_{lin}$ is created by circuit 22. The thermistor 31 generates a temperature varying bias voltage at the base of transistor 27, which is converted into a temperature varying current by the transistor 27 and the resistor 28. The emitter of transistor 27 is essentially always at a voltage +0.7 volts below the bias voltage at the base, since the transistor is operative throughout the cold, middle, and hot temperature ranges. Thus the bias voltage and resistor 28 determine $I_{lin}$ which has a temperature variation similar to tha of the bias voltage.

In the middle temperature range, the non-linear variation of the thermistor 31 in circuit 22 is linearized by the resistor 32 and a stepless linear varying bias voltage for the transistor 27 is produced at temperatures around an inflection point (the temperature at which the resistance of thermistor 31 equals the value of resistor 32). As the temperature increases, the resistance of the thermistor 31 decreases and the bias voltage applied will depend primarily upon the resistor 29 and diode 30. This voltage and resistor 28 will determine the current that generator 42 will produce at high temperatures. As the temperature decreases, the resistance of thermistor 31 increases such that the bias voltage is determined primarily by resistors 29 and 32 and diode 30. This voltage along with resistor 28 will determine the current that generator 42 will approach at cold temperatures.

The inflection point in the middle temperature range is determined solely by the thermistor 31 and resistor 32. The slope of $I_{lin}$ in the middle temperature range is primarily determined by the value of the resistor 28. The current $I_{lin}$ is stepless, having no abrupt changes in amplitude or slope, since $I_{lin}$ has the same temperature variation as the bias voltage for the transistor 27. The diode 30 is used to provide temperature compensation for the base emitter junction of the transistor 27. However, when this compensation is not required, diode 30 can be replaced by the resistor 30' (shown dashed in FIG. 2) and the sensitivity of $I_{lin}$ to power supply variations will be reduced.

Therefore the circuit 22 can independently create a voltage having a linear temperature varying characteristic, which includes a point of inflection, in a middle temperature range. The slope of the temperature varying characteristic can be adjusted by changing the value of a single resistor 28. A change in the value of resistor 28 will also result in a shift in the absolute value of $I_{lin}$. However, this shift can be compensated for by adjusting the resistance of resistor 29 and/or diode 30 (or resistor 30'). The circuit 22 also independently creates a non-linear voltage variation in the hot and cold ranges due to the asymptotic behavior of $I_{lin}$.

In FIG. 4A, the current produced by the generator 43 is shown as a negative current 43' ($I_{cold}$) which is approximately zero at all temperatures above approximately −5°C. and increases exponentially as the temperature decreases from −5°C.

The circuit 23 in FIG. 2 produces the current 43'. At temperatures above a predetermined temperature (approximately −5°C), the thermistor 36 has a relatively low value of resistance with respect to the resistors 35 and 37 and therefore the bias voltage across the base emitter junction of transistor 33 is less than 0.7 volts. Thus transistor 33 is inoperative and produces no significant output current at its collector. At −5°C, the resistance of the thermistor 36 is such that a bias voltage sufficient to just barely turn on the transistor 33 is provided across the base emitter junction. At temperatures below −5°C, transistor 33 will be turned on and the amount of current produced at its collector ($I_{cold}$) will be determined by the value of resistor 34.

The bias voltage produced at the base of the transistor 33, in the cold temperature range, will vary primarily as the resistance of thermistor 36, since the temperature at which the thermistor's resistance will equal the resistance of the resistor 37 is selected to be below the cold temperature range. The current ($I_{cold}$) produced by the transistor 33 will initially vary exponentially as a function of the bias voltage when the transistor turns on. As the bias voltage increases, $I_{cold}$ will vary directly as a function of the bias voltage which is varying non-linearly. Thus circuit 23 represents the cold current generator 43 having a predetermined turn on temperature controlled by components 35, 36 and 37 and a magnitude controlled primarily by resistor 34. As long as the turn on temperature for the transistor 33 is below the middle temperature range, any adjustments in circuit 23 will not affect the substantially linear middle range current variation of $I_{total}$ which includes $I_{cold}$. However, adjustments in the linear circuit 22 may require an adjustment in the cold circuit 23 to obtain a predetermined desired output voltage versus temperature characteristic.

In FIG. 4A, the current curve 44' ($I_{hot}$) is substantially zero until approximately +60°C and then rises exponentially as a function of temperature. The circuit 24 creates $I_{hot}$ in a manner similar to the way that cold circuit 23 creates $I_{cold}$. Thermistor 40 and resistor 41 are selected to provide, at temperatures below +60°C, less than 0.7 volts between the base of transistor 38 and ground. At temperatures above +60°C, a voltage greater than 0.7 volts is applied between the base and ground, and transistor 38 is therefore turned on. The transistor 40 and the resistor 41 are selected so that the voltage at the base of the transistor 38 will vary non-linearly and approximately the same as the resistance of thermistor 40 in the hot temperature range, since the temperature at which the resistance of thermistor 40 will equal resistor 41 is above the hot temperature range. Thus circuit 24 produces a non-linear current variation above a predetermined temperature and is inoperative to produce a current versus temperature variation in the middle and cold temperature ranges. The turn on point of transistor 38 is determined by thermistor 40 and resistor 41, and the magnitude of the current $I_{hot}$ produced by circuit 24 depends primarily upon resistor 39.

Figure 4B:
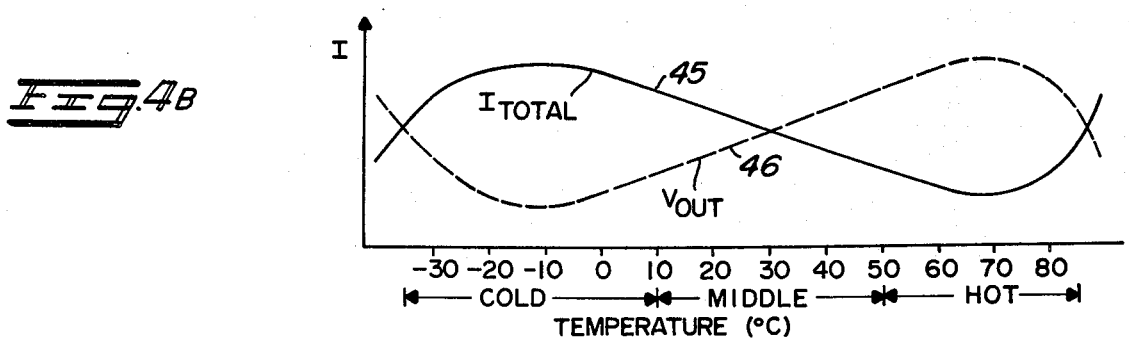
FIG. 4B is a graphical representation of the total current through a component shown in FIG. 3 and its resultant compensating voltage output as a function of temperature.

Referring to FIG 4B, a curve 45 of the current $I_{total}$, which flows through resistor 25, is illustrated. This current is seen to be the linear combination of the currents created by the generators 42, 43, and 44, according to the prior equations. A curve 46 (shown dashed) represents a plot of the voltage $V_{out}$ between terminals 18 and 19 and is likewise derived from the prior equations by assuming that the B+ voltage is constant. Therefore the voltage versus temperature characteristic 46 is just the inverse of the current versus temperature characteristic 45.

Thus the circuit 16 in FIG. 2, has created a control voltage $V_{out}$ which has an independently generated stepless substantially linear section in a middle temperature range, a substantially non-linear temperature variation and a change of slope polarity in a cold temperature range, and a substantially non-linear temperature variation and a change of slope polarity in a hot temperature range. While circuit 22 independently creates the linear middle range variation, it also creates a non-linear variation in the cold and hot ranges. However, circuits 23 and 24 primarily create the non-linear variations in the cold and hot ranges, respectively. By applying this control voltage across a varactor diode to control the resonant frequency of a crystal oscillator, the resonant frequency can be maintained at a substantially constant value throughout the cold, middle and hot temperature ranges. Since the linear middle range temperature variation can be independently adjusted and then the hot and cold range temperature variations can subsequently be adjusted without affecting the previous middle range adjustment or each other, a voltage which can compensate any AT cut crystal having a frequency versus temperature characteristic similar to those shown in FIG. 1 can be generated. If a small amount of frequency versus temperature variation can be tolerated over the temperature ranges, possibly only one of the circuits 23 and 24 may be required since circuit 22 does contribute some non-linearity in the hot and cold ranges. In one particular embodiment, this was found to be the case.

In a typical embodiment of the invention, test results showed that AT crystals having frequency stabilities of 10 to 30 PPM (parts per million) could be compensated to less than 2 PPM over a temperature range of −30°C to +85°C when the following typical component values were used and diode 30 was replaced by a resistor 30' having a value of 5K to 25K ohms.

| | |
|---|---|
| $R_{25}$ | 20K ohms |
| $R_{28}$ | 4K–15K ohms |
| $R_{29}$ | 50K ohms |
| $T_{31}$ | 20K ohms at R.T. (B=3980, $\alpha$ = −4.4%/°C) |
| $R_{32}$ | 18K ohms |
| $R_{34}$ | 10K–45K ohms |
| $R_{35}$ | 60K ohms |
| $T_{36}$ | 3K ohms at R.T. (B=3070, $\alpha$ = −3.4%/°C) |
| $R_{37}$ | 50K ohms |
| $R_{39}$ | 7K–20K ohms |
| $T_{40}$ | 150K ohms at R.T. (B=4200, $\alpha$ = −4.5%/°C) |
| $R_{41}$ | 4K ohms |
| B+ | 4.6 volts |

Beta ($\beta$) and Alpha ($\alpha$) are the manufacturer's specifications for the non-linear variation of the resistance of the thermistors.

While I have shown and described specific embodiments of this invention, further modifications and improvements will occur to those skilled in the art. All such modifications which retain the basic underlying principles disclosed and claimed herein are within the scope of this invention.

I claim:

1. A temperature compensating circuit for an oscillator having a frequency determining crystal and operative in cold, middle, and hot temperature ranges, comprising:

voltage variable reactance means coupled to the cyrstal of the oscillator for varying the oscillator frequency in response to a voltage applied to said reactance means;

compensating means for generating a control voltage with a voltage versus temperature characteristic having a substantially linear variation in said middle temperature range and a substantially non-linear variation in at least one of said hot and cold temperature ranges; and means for coupling said control voltage to said reactance means whereby said oscillator frequency is maintained at a substantailly constant value over all of said temperature ranges;

said compensating means including first circuit means for independently creating said linear variation in said middle range and second circuit means for substantailly creating said non-linear variation in said one of said temperature ranges, said second circuit means including circuitry for independently determining the operative temperature range in which said second circuit means produces any substantial variation in said control voltage as a function of temperature.

2. A temperature compensating circuit according to claim 1 wherein said first circuit means includes a first thermistor and said second circuit means includes a second thermistor, and wherein said first circuit means includes circuitry for making said substantially linear variation stepless.

3. A temperature compensating circuit according to claim 1 wherein said first circuit means includes circuitry for creating an inflection point in said substantially linear variation of said control voltage in said middle temperature range.

4. A temperature compensating circuit for an oscillator having a frequency determining crystal and operative in cold, middle, and hot temperature ranges, comprising:

voltage variable reactance means coupled to the crystal of the oscillator for varying the oscillator frequency in response to a voltage applied to said reactance means;

compensating means for generating a control voltage with a voltage versus temperature characteristic having a substantially linear variation in said middle temperature range and a substantially non-linear variation and change of slope polarity in at least one of said hot and cold temperature ranges; and means for coupling said control voltage to said reactance means whereby said oscillator frequency is maintained at a substantially constant value over all of said temperature ranges;

said compensating means including first circuit means for independently creating said linear variation in said middle range and second circuit means for substantially creating said non-linear variation in said one of said temperature renges, said second circuit means including circuitry for independently determining the operative temperature range in which said second circuit means produces any substantial variation in said control voltage as a function of temperature.

5. A temperature compensating circuit according to claim 4 wherein said first circuit means includes a first temperature sensing element and creates a first temperature varying bias voltage, and said second circuit means includes a second temperature sensing element and creates a second temperature varying bias voltage.

6. A temperature compensating circuit according to claim 5 wherein said first circuit means includes circuitry for creating an inflection point in said substantially linear variation of said control voltage in said middle temperature range.

7. A temperature compensating circuit according to claim 6 wherein said first temperature sensing element is a first thermistor and said second temperature sensing element is a second thermistor.

8. A temperature compensating circuit according to claim 7 wherein said circuitry for creating an inflection point in said middle temperature range includes a first resistor connected in parallel with said first thermistor.

9. A temperature compensating circuit according to claim 8 wherein said first circuit means includes a first transistor and said second circuit means includes a second transistor, each of said transistors having a base, a collector and an emitter, said first bias voltage being coupled across the base-emitter junction of said first transistor and said second bias voltage being coupled across the base-emitter junction of said second transistor, the transistors and their associated bias voltages independently determining the operative ranges of their associated circuit means in which these circuit means produce a substantial variation in said control voltage as a function of temperature.

10. A temperature compensating circuit according to claim 9 which includes:

a second transistor having first and second ends, said first end being coupled to the emitter of said second transistor, and said second bias voltage applied between the base of said second transistor and the second end of said second resistor; and a third resistor having first and second ends, said first end being coupled to the emitter of said first transistor, and said first bias voltage applied between the base of said first transistor and the second end of said third resistor.

11. A temperature compensating circuit according to claim 10 wherein said voltage variable reactance means includes a varactor diode.

12. A temperature compensating circuit according to claim 11 wherein said varactor diode is a super abrupt diode having a substantially linear voltage versus reactance characteristic.

13. A temperature compensating circuit for an oscillator having a frequency determining crystal and operative in cold, middle and hot temperature ranges, comprising:

voltage variable reactance means coupled to the crystal of the oscillator for varying the oscillator frequency in response to a voltage applied to said reactance means;

compensating means for generating a control voltage with a voltage versus temperature characteristic having a substantially linear variation in said middle temperature ranfr, a substantially non-linear variation in said cold temperature range, and a substantially non-linear variation in said hot temperature range; and means for coupling said control voltage to said reactance means whereby said oscillator frequency is maintained at a substantially constant value over all of said temperature ranges;

said compensating means including first circuit means for independently creating said linear variation in said middle temperature range, second circuit means for substantially creating said non-linear temperature variation in said cold temperature range, and third circuit means for substantially creating said non-linear temperature variation in said hot temperature range, said second and third circuit means each including associated circuitry for independently determining the operative temperature range in which said second and third circuit means, respectively, produce any substantial variation in said control voltage as a function of temperature.

14. A temperature compensating circuit according to claim 13 wherein said first, second and third circuits each include an associated first, second, and third temperature sensing element, respectively.

15. A temperature compensating circuit according to claim 14 wherein said first circuit includes circuitry for producing a stepless first temperature varying signal, said first signal being used to create said linear variation of said control voltage and make said linear variation stepless.

16. A temperature compensating circuit according to claim 15 wherein said second circuit is only operative for producing a second temperature varying signal below a first predetermined temperature, and said third circuit is only operative for producing a third temperature varying signal above a second predetermined temperature, said second and third signals being used to create said control voltage.

17. A temperature compensating circuit according to claim 16 wherein said first circuit includes circuitry for creating an inflection point in said substantially linear variation of said control voltage.

18. A temperature compensating circuit of an oscillator having a frequency determining crystal and operative in cold, middle, and hot temperature ranges, comprising:

voltage variable reactance means coupled to the crystal of the oscillator for varying the oscillator frequency in response to a voltage applied to said reactance means;

compensating means for generating a control voltage with a voltage versus temperature characteristic having a substantially linear variation in said middle temperature range, a substantially non-linear variation and a change of slope polarity in one of said hot and cold temperature ranges, and a substantially non-linear variation in the other of said hot and cold temperature ranges; and means for coupling said control voltage to said reactance means whereby said oscillator frequency is maintained at a substantially constant value over all of said temperature ranges;

said compensating means including first circuit means, operative in all of said temperature ranges, for independently creating said linear variation in said middle temperature range and said non-linear variation in said other temperature range, and second circuit means for substantially creating said non-linear variation in said one of said temperature ranges, said second circuit means including circuitry for independently determining the operative temperature range in which said second circuit means produces any substantial variation in said control voltage as a function of temperature.

19. A temperature compensating circuit for an oscillator having a frequency determining crystal and operative in cold, middle, and hot temperature ranges, comprising:

voltage variable reactance means coupled to the crystal of the oscillator for varying the oscillator frequency in response to a voltage applied to said reactance means;

compensating means for generating a control voltage with a voltage versus temperature characteristic having a substantially linear variation in said middle temperature range, a substantially non-linear variation and a change of slope polarity in said cold temperature range, and a substantially non-linear variation and a change of slope polarity in said hot temperature range; and means for coupling said control voltage to said reactance means whereby said oscillator frequency is maintained at a substantially constant value over all of said temperature ranges;

said compensating means including first circuit means for independently creating said linear variation in said middle temperature range, second circuit means for substantially creating said non-linear temperature variation in said cold temperature range, and third circuit means for substantially creating said non-linear temperature variation in said hot temperature range, said second and third circuit means each including associated circuitry for independently determining the operative temperature range in which said second and third circuit means, respectively, produce any substantial variation in said control voltage as a function of temperature.

20. A temperature compensating circuit according to claim 1 wherein each of said circuit means includes associated circuity for independently determining the magnitude of the control voltage versus temperature variation contributed by it.

21. A temperature compensating circuit according to claim 1 wherein said second circuit means includes a threshold device and an associated threshold device biasing circuit means, said biasing circuit means including a temperature varying component coupled to said threshold device for determining independently of said first circuit means, at what temperature the threshold device will be turned on.

22. A temperature compensating circuit according to claim 21 wherein said threshold device comprises the base-emitter junction of a transistor.

* * * * *